United States Patent
Disegni et al.

(10) Patent No.: US 10,861,543 B2
(45) Date of Patent: *Dec. 8, 2020

(54) DEVICE FOR SWITCHING BETWEEN DIFFERENT READING MODES OF A NON-VOLATILE MEMORY AND METHOD FOR READING A NON-VOLATILE MEMORY

(71) Applicant: STMicroelectronics S.r.l., Agrate Brianza (IT)

(72) Inventors: Fabio Enrico Carlo Disegni, Spino d'adda (IT); Cesare Torti, Pavia (IT); Davide Manfré, Pandino (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/804,698

(22) Filed: Feb. 28, 2020

(65) Prior Publication Data

US 2020/0202930 A1 Jun. 25, 2020

Related U.S. Application Data

(63) Continuation of application No. 16/227,438, filed on Dec. 20, 2018, now Pat. No. 10,600,479.

(30) Foreign Application Priority Data

Jan. 9, 2018 (IT) .................. 102018000000632

(51) Int. Cl.
*G11C 11/00* (2006.01)
*G11C 13/00* (2006.01)
(Continued)

(52) U.S. Cl.
CPC ........ *G11C 13/004* (2013.01); *G06F 13/1668* (2013.01); *G06F 13/4068* (2013.01);
(Continued)

(58) Field of Classification Search
CPC . G11C 11/4091; G11C 11/4094; G11C 16/06; G11C 7/1048; G11C 7/12
See application file for complete search history.

(56) References Cited

U.S. PATENT DOCUMENTS

| | | | |
|---|---|---|---|
| 6,687,175 B1 | 2/2004 | Mizuno et al. | |
| 7,684,272 B2 * | 3/2010 | Matsubara | .......... G11C 11/4091 365/189.03 |

(Continued)

*Primary Examiner* — Tuan T Nguyen
(74) *Attorney, Agent, or Firm* — Slater Matsil, LLP

(57) ABSTRACT

In one embodiment, a memory device includes a first sense amplifier, a second sense amplifier, a first lower switch arranged between a first lower main bit line and a first input of the first sense amplifier, a second lower switch arranged between the first lower main bit line and a first input of the second sense amplifier, a first upper switch arranged between a first upper main bit line and the first input of the first sense amplifier, a second upper switch arranged between the first upper main bit line and the first input of the second sense amplifier, a third lower switch arranged between a second lower main bit line to a second input of the first sense amplifier, and a third upper switch arranged between a second upper main bit line to a second input of the second sense amplifier.

20 Claims, 10 Drawing Sheets

(51) Int. Cl.
    *G11C 7/18*     (2006.01)
    *G06F 13/16*     (2006.01)
    *G06F 13/40*     (2006.01)

(52) U.S. Cl.
    CPC .............. *G11C 7/18* (2013.01); *G11C 13/003* (2013.01); *G11C 13/0004* (2013.01); *G11C 13/0026* (2013.01); *G11C 13/0028* (2013.01); *G11C 2013/0042* (2013.01); *G11C 2207/005* (2013.01); *G11C 2213/79* (2013.01)

(56) References Cited

U.S. PATENT DOCUMENTS

| | | | |
|---|---|---|---|
| 10,600,479 B2* | 3/2020 | Disegni | G11C 13/003 |
| 2007/0242541 A1* | 10/2007 | Placa | G11C 11/5642 |
| | | | 365/207 |
| 2011/0188311 A1 | 8/2011 | Stiegler et al. | |
| 2012/0057400 A1 | 3/2012 | Kim et al. | |
| 2013/0051114 A1* | 2/2013 | Kim | G11C 7/067 |
| | | | 365/145 |
| 2013/0258766 A1 | 10/2013 | Conte et al. | |
| 2014/0036596 A1* | 2/2014 | Chan | G11C 16/28 |
| | | | 365/185.21 |
| 2015/0117120 A1 | 4/2015 | Barth, Jr. et al. | |
| 2016/0196873 A1 | 7/2016 | Noguchi et al. | |
| 2016/0276000 A1 | 9/2016 | Khayatzadeh et al. | |
| 2020/0051622 A1* | 2/2020 | Wang | G11C 11/5628 |

* cited by examiner

DEVICE FOR SWITCHING BETWEEN DIFFERENT READING MODES OF A NON-VOLATILE MEMORY AND METHOD FOR READING A NON-VOLATILE MEMORY

CROSS-REFERENCE TO RELATED APPLICATIONS

This application is a continuation application of U.S. application Ser. No. 16/227,438, filed on Dec. 20, 2018, which claims the benefit of Italian Application No. 102018000000632, filed on Jan. 9, 2018, which applications are hereby incorporated herein by reference.

TECHNICAL FIELD

The present invention relates to a device for switching between different reading modes of a non-volatile memory, such as a phase-change memory (PCM), and to a corresponding method for reading a non-volatile memory.

BACKGROUND

Phase change memories (PCMs) are a new generation of non-volatile memories in which, in order to store information, the characteristics of materials having the property of switching between phases with different electrical characteristics are exploited. These materials may switch between a disorderly/amorphous phase and an orderly crystalline or polycrystalline phase; different phases are characterized by different values of resistivity and are consequently associated to different values of a data item stored. For instance, it is possible to use elements of Group VI of the periodic table, such as tellurium (Te), selenium (Se), or antimony (Sb), referred to as "chalcogenides" or "chalcogenic materials", to form phase-change memory elements. In particular, an alloy made up of germanium (Ge), antimony (Sb), and tellurium (Te), known as GST (having chemical composition Ge2Sb2Te5) currently finds wide use in such memory cells.

Phase change in a memory element may be obtained by locally increasing the temperature of the cell of chalcogenic material, through resistive electrodes (generally known as "heaters") arranged in contact with the regions of chalcogenic material.

Access (or selection) devices (for example, bipolar or MOS transistors) are connected to the heaters so as to enable selective passage of the programming electric current (also known as writing electric current) through them. This electric current, by the Joule effect, generates the temperatures required for phase change.

In particular, when the chalcogenic material is in the amorphous state, and thus has a high resistivity (the so-called RESET state), it is necessary to apply a current/voltage pulse (or a suitable number of current/voltage pulses) of a duration and amplitude such as to enable the chalcogenic material to cool slowly. Subjected to this treatment, the chalcogenic material changes state and switches from the high-resistivity state to a low-resistivity state (the so-called SET state). Conversely, when the chalcogenic material is in the SET state, it is necessary to apply a current/voltage pulse having an appropriate duration and a large amplitude so as to cause the chalcogenic material to return into the high-resistivity amorphous RESET state.

During reading, the state of the chalcogenic material is detected by applying a voltage sufficiently low as not to cause a sensible heating thereof, and then reading the value of the current flowing in the memory cell through a sense amplifier. Given that the current is proportional to the conductivity of the chalcogenic material, it is possible to determine in which state the material is, and consequently determine the data item stored in the memory cell.

SUMMARY

As illustrated schematically in FIG. 1, a non-volatile PCM device, designated by the reference number 1, in general includes a memory array 2 formed by a plurality of memory cells 3, arranged in rows, or word lines WL, and columns, or bit lines BL.

Each memory cell 3 is formed by a storage element 3a and by an access element 3b, which are connected in series between a respective bit line BL and a reference-potential terminal (for example, ground, GND). A word line WL is defined by the set of all the control terminals of the access elements 3b aligned along a same row.

The storage element 3a includes an element of phase-change material (for example, a chalcogenide, such as GST) and is consequently able to store data in the form of resistance levels associated to the different phases assumed by the material itself.

The access element 3b is, for example, an N-channel MOS transistor having its gate terminal connected to a respective word line WL, its drain terminal being connected to the storage element 3a, and its source terminal being connected to the reference-potential terminal. The access element 3b is controlled and biased so as to enable, when selected, passage of a reading, or else a programming, current, through the storage element 3a.

A column decoder 4 and a row decoder 5 enable selection of the memory cells 3, on the basis of address signals received at input (designated as a whole by AS) and more or less complex decoding schemes. The address signals AS may be generated by a control logic CL, which further controls the column decoder 4 and the row decoder 5 so as to enable reading and programming of the memory cells 3 addressed by the address signals AS. Albeit not shown, the control logic CL supplies to the column decoder 4 and to the row decoder 5 also control signals, in order to control the aforementioned reading/programming operations.

In particular, the column decoder 4 and the row decoder 5 enable selection of the word lines WL and of the bit lines BL each time addressed, and thus enable biasing of the word lines WL and bit lines BL selected at appropriate voltage values. In this connection, it should be noted that the SET and RESET programming operations may be carried out on "words" containing a number Nb of bits (Nb being an integer higher than or equal to 1), i.e., on a number Nb of memory cells 3 in a word line WL.

The column decoder 4 is consequently designed for selecting for programming/reading a sort of "macrocolumn", i.e., a set of bit lines BL formed by a number Nb corresponding to the number of bits of the word to be programmed (the bit lines BL, one for each memory cell 3, are selected simultaneously by the column decoder 4).

The column decoder 4 is further configured to implement internally two distinct paths towards the bit lines BL of the memory array 2 each time selected: a reading path, designed for creating selectively a conductive path between each bit line BL selected and a reading stage 7; and a programming path, designed for creating selectively a conductive path between each bit line BL selected and a programming stage 8 configured to supply the currents required for the operations of programming the SET and RESET states.

For this purpose, the column decoder 4 includes, for each reading and programming path, appropriate selection elements (in particular, controlled transistors), connected in cascaded mode and configured to implement a hierarchical address decoder for selection of the memory cells 3.

In particular, as illustrated schematically in FIG. 2, the memory array 2 is usually organized in a plurality of sectors S, each of which includes a plurality of memory cells 3.

Each sector S includes a plurality of respective word lines WL and respective local bit lines, designated once again by BL and distinct from those of the other sectors, which are physically connected to the memory cells 3 present in the sector S itself. In addition, for each set of local bit lines BL (in FIG. 2, formed by four local bit lines BL), two main bit lines MBL are provided: one for reading, designated by MBLr, and one for programming, designated by MBLp. In general, variants are, however, possible in which reading and programming do not envisage dedicated main bit lines.

The local bit lines BL of each sector S are specific to this sector S, i.e., they are not shared between different sectors S. Instead, the main bit lines MBL may be shared between two or more sectors, as shown precisely in FIG. 2, where a reading main bit line MBLr and a programming main bit line MBLp are visible, which are shared between the two sectors S represented in FIG. 2, i.e., they may be electrically coupled to local bit lines BL of both of the sectors S, provided that this is not done simultaneously.

The main bit lines MBLr and MBLp may be selected at a higher hierarchical level and enable, when selected, subsequent selection, at a lower hierarchical level, of one or more of the respective local bit lines BL and of the corresponding memory cells 3.

As mentioned previously and shown in greater detail in FIG. 3, each local bit line BL may be connected to a respective reading main bit line MBLr and a respective programming main bit line MBLp via a first MOS switch 10P and a second MOS switch 10N, respectively. In particular, the first MOS switch 10P is of a P type, whereas the second MOS switch 10N is of an N type.

In practice, the MOS switches 10P, 10N form a level of a column-decoding system further including decoder circuits for reading 12 and programming 13, respectively, which are connected to the reading and programming main bit lines MBLr and MBLp and are not represented in detail in FIG. 3. The MOS switches 10P, 10N and the reading and programming decoder circuits 12, 13 enable selection, each time, of one or more (if Nb>1) local address bit lines BL. In other words, the reading and programming decoder circuits 12, 13, and the MOS switches 10P, 10N form the column decoder 4.

In use, considering a local bit line BL selected, the reading decoder circuit 12, the reading main bit line MBLr, and the second MOS switch 10N form a connection path (typically, a low-voltage path) to the local bit line BL. Likewise, the programming decoder circuit 13, the programming main bit line MBLp, and the first MOS switch 10P form another connection path (typically, a high-voltage path) to the local bit line BL.

Once again with reference to FIG. 2, the main bit lines MBL, as mentioned previously, pass through a certain number of sectors S and may be selected in sets at a possible hierarchical decoding level even higher than the level associated to the selection of the main bit lines MBL.

The column decoder 4 consequently includes, for each sector S, at least one respective first-level decoder circuit 11 for the reading and programming operations (SET and RESET), which is coupled to the respective local bit lines BL and may be activated for selecting these local bit lines BL. The column decode 4 further includes, for each set of sectors S, a respective second-level decoder circuit 14, once again for reading and programming operations, which is coupled to the respective main bit lines MBL and may be activated for selecting the latter. As highlighted previously, there may possibly be provided also a decoder circuit at an even higher level for selection in groups of the main bit lines MBL. In what follows, it is assumed that this decoder circuit at an even higher level is absent, except where otherwise specified.

In greater detail, each first-level decoder circuit 11 includes a respective first-level subcircuit 11a for reading operations, and a respective first-level subcircuit 11b for programming operations. Likewise, each second-level decoder circuit 14 includes a respective second-level subcircuit 14a for reading operations, and a respective second-level subcircuit 14b for programming operations. Typically, the decoder circuits for reading operations are provided with N-channel CMOS transistors, whereas the decoder circuits for programming operations are provided with P-channel CMOS transistors.

For instance, the first-level subcircuits 11a for reading operations and the first-level subcircuits 11b for programming operations include, respectively, the second and first MOS switches 10N, 10P. In addition, the second-level subcircuits 14a for reading operations and the second-level subcircuits 14b for programming operations form, respectively, the reading decoder circuit 12 and the programming decoder circuit 13.

For practical purposes, considering any the aforementioned sets of four local bit lines BL of a sector S, the first-level subcircuit 11a for reading operations coupled to this sector S may be controlled electrically so as to electrically couple, each time, one of the four local bit lines BL (in particular, the local bit line selected) to the corresponding reading main bit line MBLr, which is in turn coupled, during reading, to the reading stage 7. Coupling to the reading main bit line MBLr also entails biasing of the local bit line selected. Similar considerations apply to the first-level subcircuit 11b for programming operations coupled to this sector S and the corresponding programming main bit line MBLp, which is in turn coupled, during programming, to the programming stage 8, which is also known as "program load".

As mentioned previously, the local bit lines BL of each sector S are thus specific for this sector S; i.e., they are not shared between different sectors S. Instead, the main bit lines MBL may be shared between two or more sectors, as shown precisely in FIG. 2, where one reading main bit line MBLr and one programming main bit line MBLp are visible, which are shared between the two sectors S visible in FIG. 2, i.e., they may be connected to individual local bit lines selected belonging to the corresponding two sets of four local bit lines BL of the two sectors S shown. In this connection, with reference, for example, to the reading main bit line MBLr shown in FIG. 2, during reading, the two first-level subcircuits 11a for reading operations coupled to the two sectors S operate so that the reading main bit line MBLr is electrically coupled to just one of the eight local bit lines BL of the corresponding two sets of four local bit lines BL of the two sectors S. Similar considerations apply to the first-level subcircuits 11b for programming operations coupled to the two sectors S illustrated in FIG. 2 and to the corresponding programming main bit line MBLp, which is in turn coupled, during programming, to the programming stage 8.

As shown once again in FIG. 2, each sector S is further associated to a corresponding portion (designated by 5a) of the row decoder 5, to which the respective word lines WL are connected.

Purely by way of example, a possible architecture of the column decoder 4 is described in U.S. Patent Publication No. 2013/0258766A1.

Once again with reference to the reading stage 7, in the case where the PCM device 1 is, for example, of a so-called single-ended type, it is configured to compare the current that circulates in the memory cell 3 selected with a reference current in order to determine the data item stored; alternatively, if the PCM device 1 is of a differential type, i.e., if it is such that the data are programmed in pairs of memory cells 3 so that the cells of each pair store opposite data, the reading stage 7 is configured to compare the currents that circulate in the memory cells 3 of the pair selected.

In general, the PCM device 1 represents an example of differential structure. In particular, the structure of the memory array 2 may be represented schematically as illustrated in FIGS. 4A and 4B.

In detail, FIG. 4A shows an architecture, which in turn includes a first sector S', a second sector S'', a third sector S''', and a fourth sector S'''' of memory cells 3, each of which is connected to a corresponding portion (once again designated by 5a) of the row decoder 5.

The architecture represented in FIG. 4A includes the reading stage 7, which is arranged so that the first and third sectors S', S''' are arranged on one side of the reading stage 7, whereas the second and fourth sectors S'', S'''' are arranged on an opposite side of the reading stage 7 so as to be symmetrical with respect to the first and third sectors S', S''', respectively. Furthermore, the third sector S''' is arranged between the first sector S' and the reading stage 7, whereas the fourth sector S'''' is arranged between the second sector S'' and the reading stage 7.

In greater detail, the first, second, third, and fourth sectors S', S'', S''', S'''' are, for example, the same as one another and are each formed by a number N of columns, i.e., by a number N (for example, equal to 2048) of local bit lines (designated hereinafter by LBL). In addition, the first and second sectors S', S'' are arranged symmetrically; likewise, the third and the fourth sectors S''', S'''' are arranged symmetrically.

Further visible in FIG. 4A are a first first-level decoder circuit 11', a second first-level decoder circuit 11'', a third first-level decoder circuit 11''', and a fourth first-level decoder circuit 11'''', which, albeit not shown in FIG. 4A, include respective first-level subcircuits for reading operations and respective first-level subcircuits for programming operations.

The first and second first-level decoder circuits 11', 11'' are arranged symmetrically; in particular, the first-level subcircuits for the operations of reading of the first and second first-level decoder circuits 11', 11'' are arranged symmetrically, as likewise the first-level subcircuits for programming operations of the first and second first-level decoder circuits 11', 11''. Similar considerations apply to the third and fourth first-level decoder circuits 11''' and 11''''. This having been said, in what follows, by "first-level decoder circuit" is understood the corresponding first-level subcircuit for reading operations.

The first, second, third, and fourth first-level decoder circuits 11', 11'', 11''' and 11'''' enable selection of the local bit lines LBL, respectively, of the first, second, third, and fourth sectors S', S'', S''' and S''''. In particular, with reference, for example, to the first first-level decoder circuit 11', it enables selection, for each set formed by a number K (with K, for example, equal to thirty-two) of local bit lines LBL of the first sector S', of a single local bit line, electrically coupling it to a corresponding main bit line (in particular, to the corresponding reading main bit line, during reading), as explained in greater detail hereinafter. For this purpose, the control logic CL supplies to the first, second, third, and fourth first-level decoder circuits 11', 11'', 11''', and 11'''' corresponding sets of first-level biasing signals.

The first and third sectors S', S''' form a lower set of sectors and share a corresponding first second-level decoder circuit, designated by 14', and a plurality of main bit lines MBL; in this connection, in FIG. 4A two main bit lines are shown shared by the first and third sectors S', S''', which function as reading main bit lines and are denoted by MBL1', MBL2'. Hereinafter, the aforesaid two main bit lines will be referred to as the first and second main bit lines MBL1', MBL2'; further, by "first second-level decoder circuit 14'" is meant the corresponding second-level subcircuit for reading operations.

The second and fourth sectors S'', S'''' in turn form an upper set of sectors and share a corresponding second second-level decoder circuit, designated by 14'', and a plurality of main bit lines MBL. In this connection, illustrated in FIG. 4A are two main bit lines shared by the second and fourth sectors S'', S'''', which function as reading main bit lines and are denoted by MBL1'', MBL2''. Hereinafter, these two main bit lines will be referred to as the third and fourth main bit lines MBL1'', MBL2''; in addition, by "second second-level decoder circuit 14''" is meant the corresponding second-level subcircuit for reading operations.

The first second-level decoder circuit 14' is arranged between the third sector S''' and the reading stage 7. Likewise, the second second-level decoder circuit 14'' is arranged between the fourth sector S'''' and the reading stage 7. In addition, with reference, for example, just to the first second-level decoder circuit 14' (but similar considerations apply to the second second-level decoder circuit 14''), the first and second main bit lines MBL1'', MBL2'', as likewise the other main bit lines shared by the first and third sectors S', S''', are connected to this first second-level decoder circuit 14', which may be controlled so as to select, on the basis of second-level biasing signals generated by the control logic CL, these main bit lines, for coupling them to the reading stage 7.

In greater detail, the reading stage 7 implements a so-called reading parallelism, i.e., it enables a certain number of memory cells 3 to be read simultaneously. For this purpose, the reading stage 7 includes a plurality of sense amplifiers (not shown in FIGS. 4A and 4B), which may be coupled to the main bit lines.

Further represented in FIG. 4A are a first word line and a second word line, denoted, respectively, by WL1 and WL2. The first and second word lines WL1, WL2 are connected, respectively, to memory cells 3 of the first and second sectors S', S''. In particular, the first and second word lines WL1, WL2 correspond to one another, i.e., they are arranged symmetrically with respect to the reading stage 7 and are parallel to one another.

As shown once again in FIG. 4A, and as mentioned previously, each of the first, second, third, and fourth sectors S', S'', S''', S'''' is further associated to a corresponding portion 5a of the row decoder 5, connected to which are the respective word lines WL.

In addition, shown schematically in FIG. 4A are a first selection circuit and a second selection circuit (formed, for example, by corresponding MOS transistors of an N type) of the first first-level decoder circuit 11', which are denoted, respectively, by SC1' and SC2'.

The first selection circuit SC1' is electrically arranged between the first main bit line MBL1' and a first local bit line LBL1' of the first sector S' so as to control the corresponding electrical coupling. In addition, the second selection circuit SC2' is electrically arranged between the second main bit line MBL2' and a second local bit line LBL2' of the first sector S' so as to control the corresponding electrical coupling. The first and second local bit lines LBL1', LBL2' belong to two different sets of local bit lines LBL of the first sector S'.

Further represented in FIG. 4A is a further pair of selection circuits (formed, for example, by corresponding MOS transistors of an N type) of the second first-level decoder circuit 11", which will be referred to in what follows, respectively, as the third and fourth selection circuits SC1", SC2".

In detail, the third selection circuit SC1" is electrically arranged between the third main bit line MBL1" and a first local bit line LBL1" of the second sector S" so as to control the corresponding electrical coupling. In addition, the fourth selection circuit SC2" is electrically arranged between the fourth main bit line MBL2" and a second local bit line LBL2" of the second sector S" so as to control the corresponding electrical coupling.

The first and second local bit lines LBL1", LBL2" of the second sector S" belong to two different sets of local bit lines LBL of the second sector S". Furthermore, the first and second local bit lines LBL1", LBL2" of the second sector S" are symmetrical, respectively, with respect to the first and second local bit lines LBL1', LBL2' of the first sector S'.

Also represented in FIG. 4A are two sets of first-level biasing signals, denoted, respectively, by YO<1:K>down and YO<1:K>up, which are supplied, respectively, to the first first-level decoder circuit 11' and to the second first-level decoder circuit 11", respectively, through a first bus B1 and a second bus B2, shown only qualitatively (hatched).

The biasing signals YO<1:K>down control, among other things, the first and second selection circuits SC1', SC2'. The biasing signals YO<1:K>up control, among other things, the third and fourth selection circuits SC1", SC2".

In particular, in the case of a reading step with first and second local bit lines LBL1', LBL2' selected, the biasing signals YO<1:K>down control the connection between the first local bit line LBL1' of the first sector S' and the first main bit line MBL1', as well as the connection between the second local bit line LBL2' of the first sector S' and the second main bit line MBL2'. In addition, in the case of a reading step with selection of the first and second local bit lines LBL1", LBL2" of the second sector S", the biasing signals YO<1:K>up control the connection between the first local bit line LBL2" of the second sector S" and the third main bit line MBL1", as well as the connection between the second local bit line LBL2" of the second sector S" and the fourth main bit line MBL2".

This having been said, also represented in FIG. 4A are a first memory cell 3' and a second memory cell 3", which are connected to a same word line of the first sector S' (in particular, the aforementioned first word line WL1). Furthermore, the first and second memory cells 3', 3" are, respectively, connected to the first and second local bit lines LBL1', LBL2' of the first sector S'.

Further represented in FIG. 4A are a third memory cell 3'" and a fourth memory cell 3"", which are connected to a same word line (in particular, the aforementioned second word line WL2) of the second sector S". In addition, the third and fourth memory cells 3'", 3"" are respectively connected to the first and second local bit lines LBL1", LBL2" of the second sector S".

The first and second memory cells 3', 3" are symmetrical with respect to the third and fourth memory cells 3'", 3"", respectively. In addition, the first and second local bit lines LBL1', LBL2', although not adjacent, extend parallel to one another, have the same length and are arranged in a way aligned in a direction perpendicular to the length. Likewise, the first and second main bit lines MBL1', MBL2' extend parallel to one another, have the same length and are arranged in a way aligned in a direction perpendicular to the length.

Once again with reference to the architecture represented in FIG. 4A, the first and second memory cells 3', 3" store opposite logic data. Likewise, also the third and fourth memory cells 3'", 3"" store opposite logic data.

FIG. 4B shows a different architecture, which is also of a differential type, but in which the differential pairs are formed by memory cells, arranged, instead of in a same sector, on opposite sides of the reading stage 7, and further in sectors that are symmetrical and the same as one another.

In detail, in the architecture represented in FIG. 4B, which is here described with reference just to the differences with respect to FIG. 4A, the first and third memory cells 3', 3" store opposite logic data. In other words, in the architecture represented in FIG. 4B, each differential pair is formed by two memory cells arranged symmetrically with respect to the reading stage 7, which do not share either the word line or the local bit line.

For practical purposes, in each of the differential architectures shown in FIGS. 4A and 4B it is found that the total information stored is equal to half of the information that may potentially be stored in the memory array 2, the latter amount being a function of the total number of memory cells 3 of the memory array 2. In addition, these differential architectures are characterized by a reduced rate of reading errors.

This having been said, there is today felt the need to provide a greater flexibility. In particular, the present applicant has noted how there is felt the need to be able to switch between different reading modes of a memory array, which entail different modes of coupling the memory cells to the sense amplifiers.

The aim of the present disclosure is thus to provide a memory device that will meet at least in part the requirements noted by the present applicant.

According to the present invention, a non-volatile memory device and a reading method are provided.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
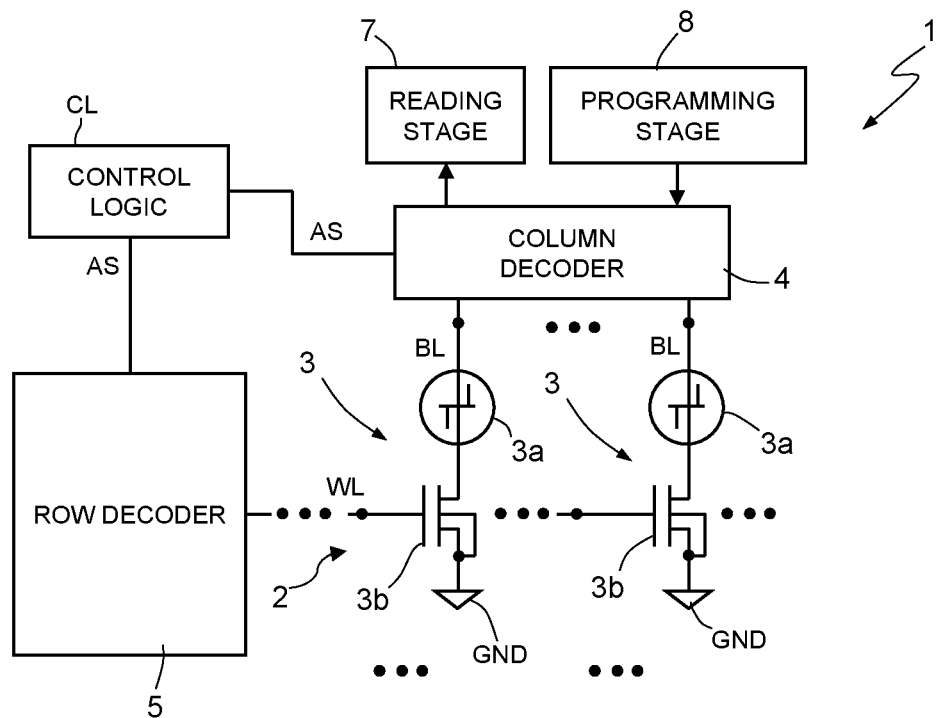
FIG. 1 shows a block diagram of a PCM device.
Figure 2:
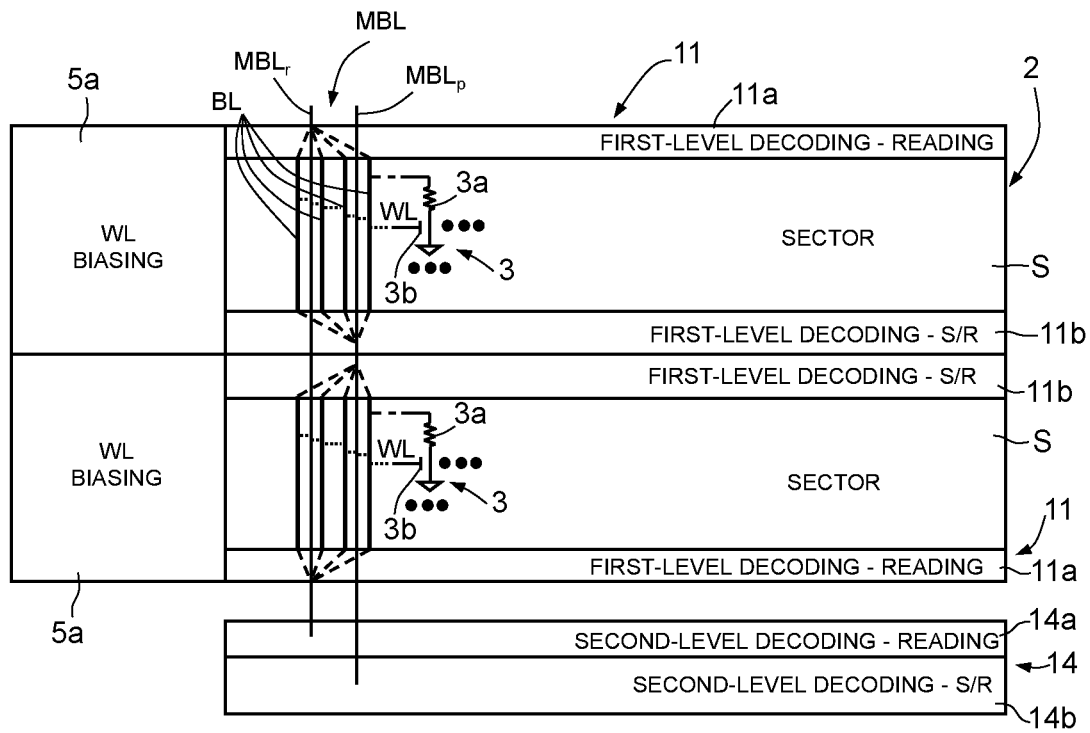
FIGS. 2 and 3 show block diagrams of portions of PCM devices.
Figure 3:
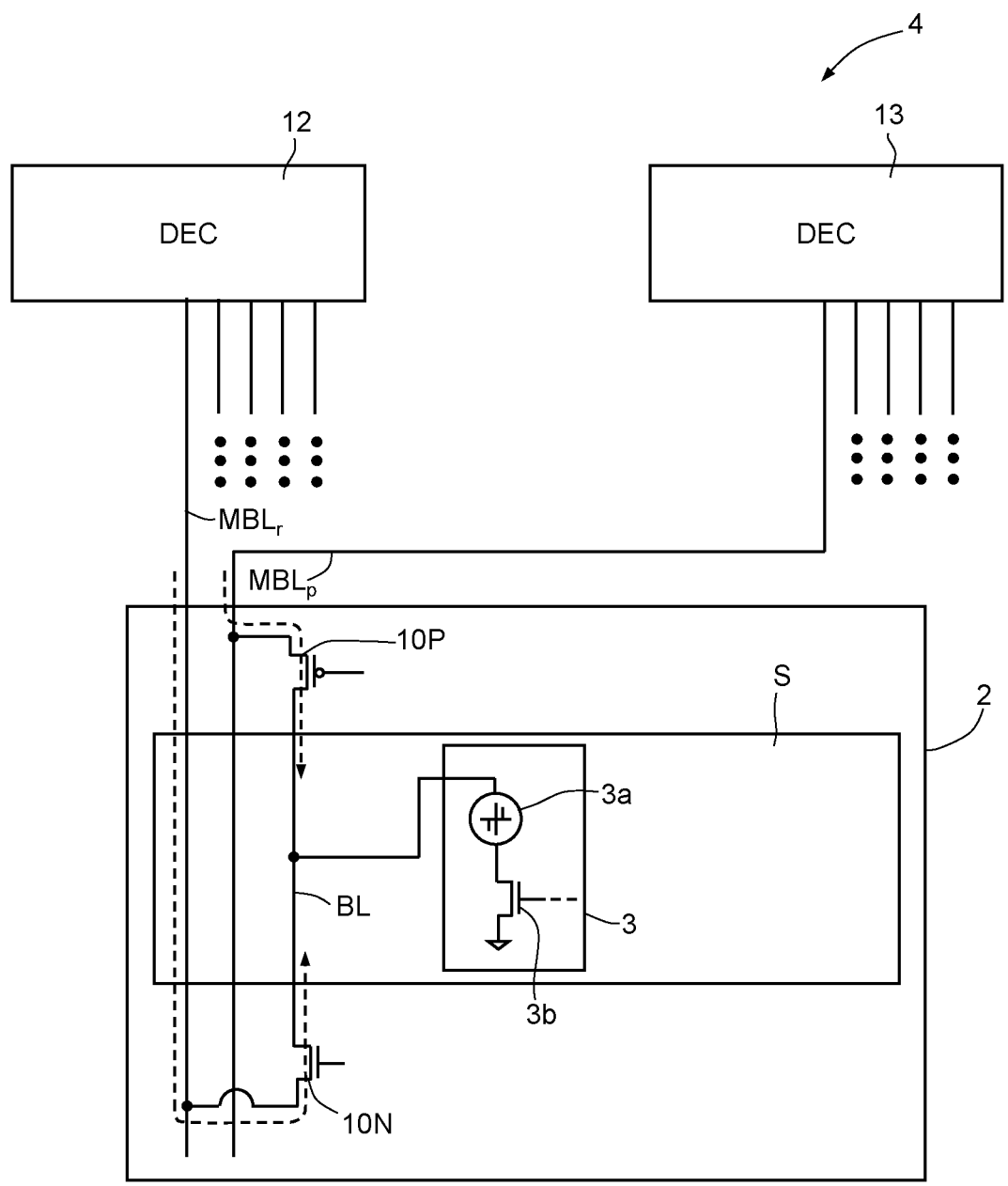
Figure 4A:
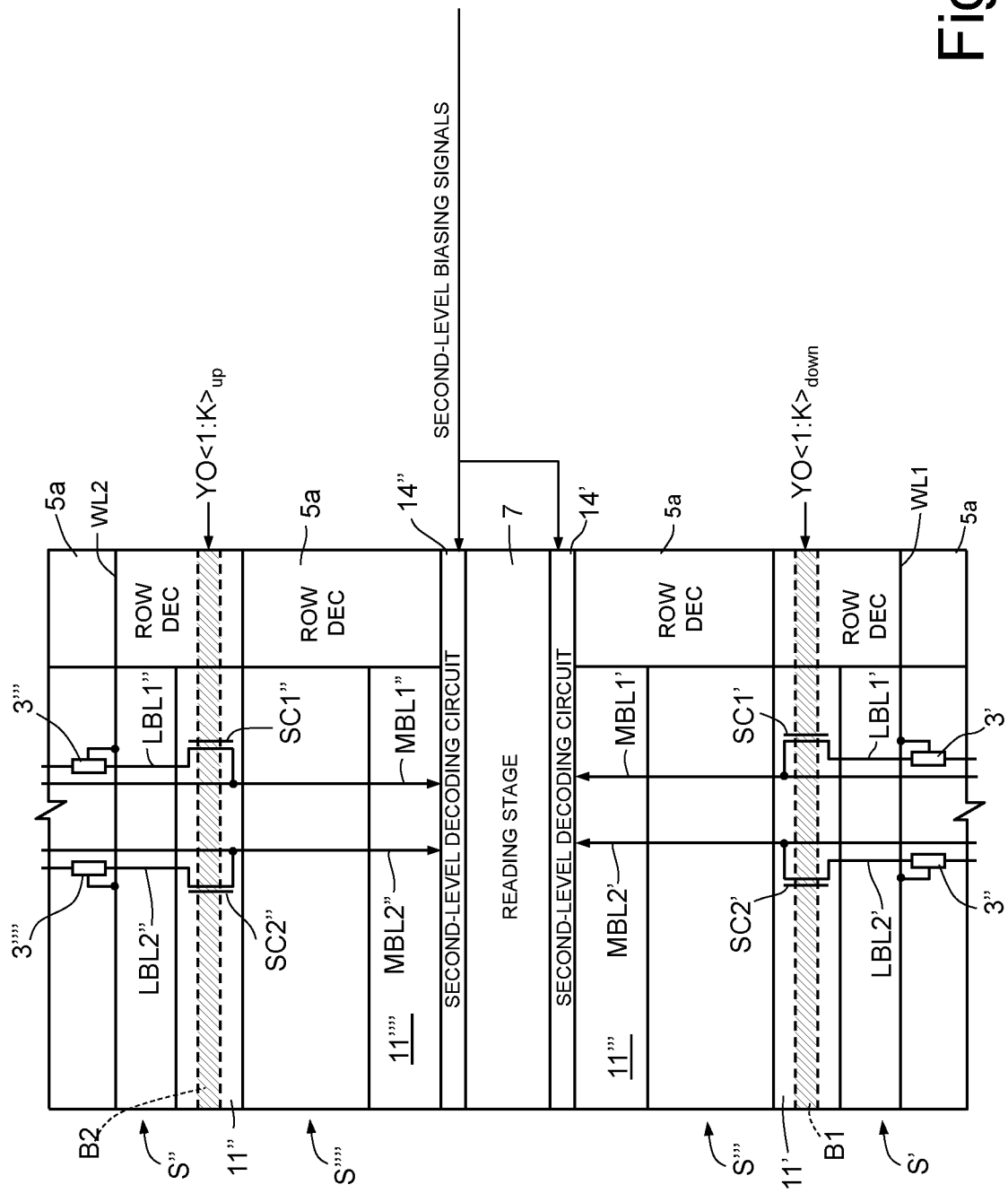
FIGS. 4A and 4B represent schematically block diagrams of portions of PCM devices.

In what follows reference is made to a PCM device 100, which is described limitedly to the differences with respect to what is shown in FIG. 4A. In addition, portions already described with reference to the PCM device 1 are identified by the same references, except where otherwise specified. Once again, for simplicity and without any loss of generality, described in what follows is operation of the PCM device 100 with reference to the operations of reading of memory cells of the first sector S' and/or the second sector S", and in particular the first, second, third, and fourth memory cells 3', 3", 3'", 3"", except where otherwise specified.

Figure 5:
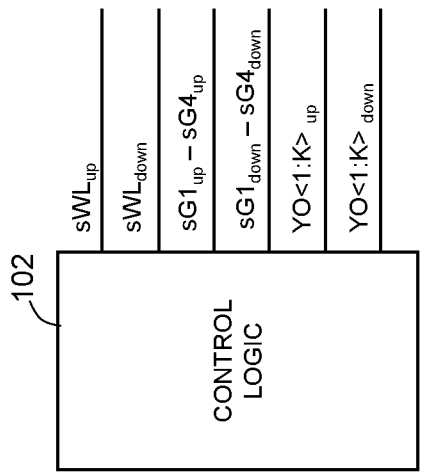
FIG. 5 represents schematically (in the form of a block) a control logic.
Figure 4B:
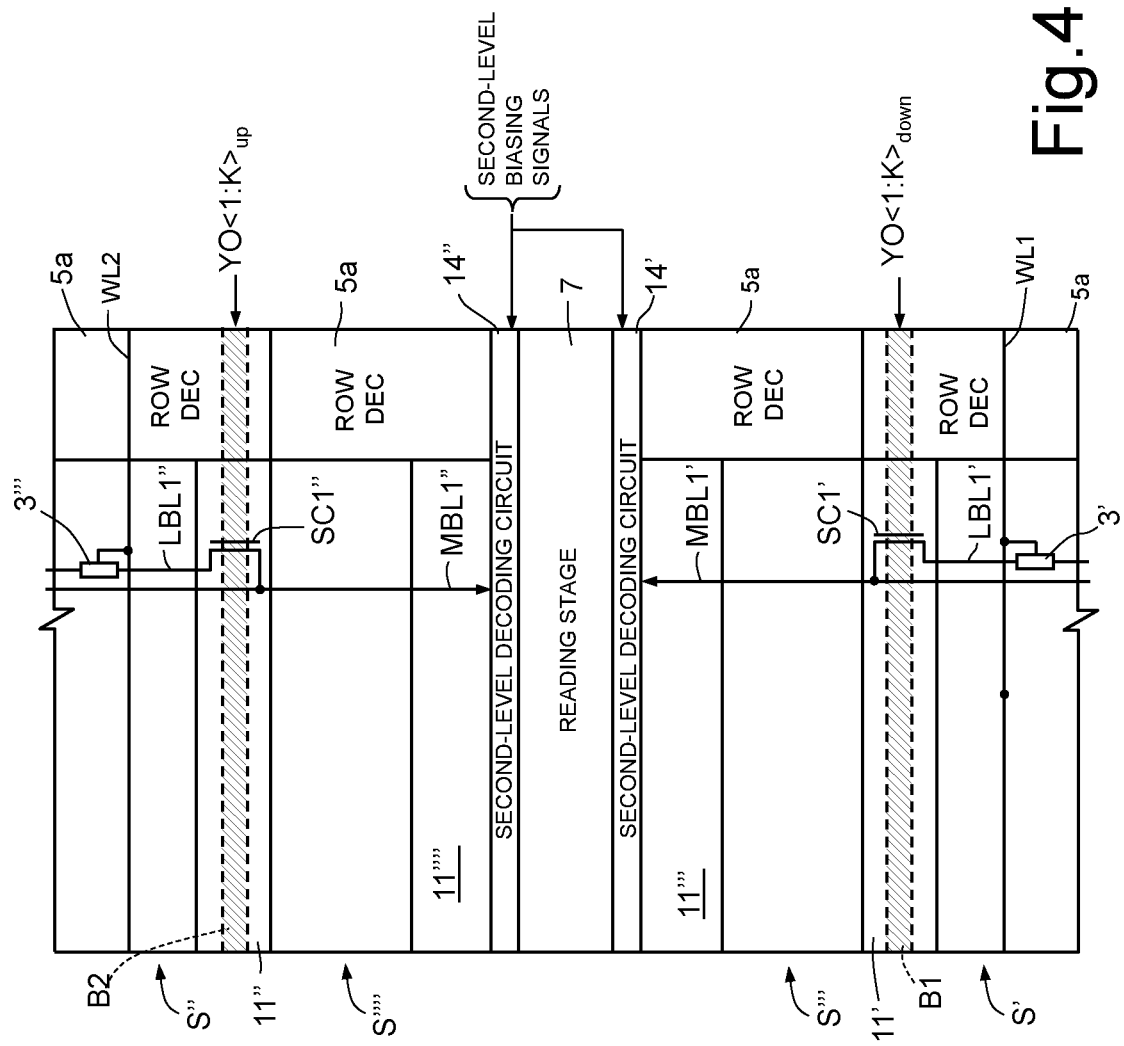

The PCM device 100 includes the control logic, designated by 102 and shown in FIG. 5, which may be controlled from outside (for example, through dedicated control signals) so as to vary the reading mode of the memory array 2, as described hereinafter.

In detail, the control logic 102 is configured to generate signals $sWL_{up}$ and $sWL_{down}$, which are supplied, respectively, (i) to the portions 5a of the row decoder 5 coupled to the first and third sectors S', S'", and (ii) to the portions 5a of the row decoder 5 coupled to the second and fourth sectors S", S"".

In general, the signals $sWL_{up}$ enable selection of a word line from the word lines WL of the second and fourth sectors S", S"". In addition, the signals $sWL_{down}$ enable selection of a word line from the word lines WL of the first and third sectors S', S'". As mentioned previously, in what follows reference is made to selection of word lines WL of the first and second sectors S', S", except where otherwise specified.

The control logic 102 further generates first-level biasing signals $YO<1:K>_{down}$ and $YO<1:K>_{up}$, which are supplied, respectively, to the first first-level decoder circuit 11' and to the second first-level decoder circuit 11" so as to select respective local bit lines of the first and second sectors S', S". Further first-level biasing signals, generated by the control logic 102 and sent to the third and fourth first-level decoder circuits 11'", 11"" are not shown or described any further.

In addition, the control logic 102 generates the signals $sG1_{up}$, $sG2_{up}$, $sG3_{up}$, $sG4_{up}$ and the signals $sG1_{down}$, $SG2_{down}$, $SG3_{down}$, $SG4_{down}$, described in detail hereinafter.

Figure 6:
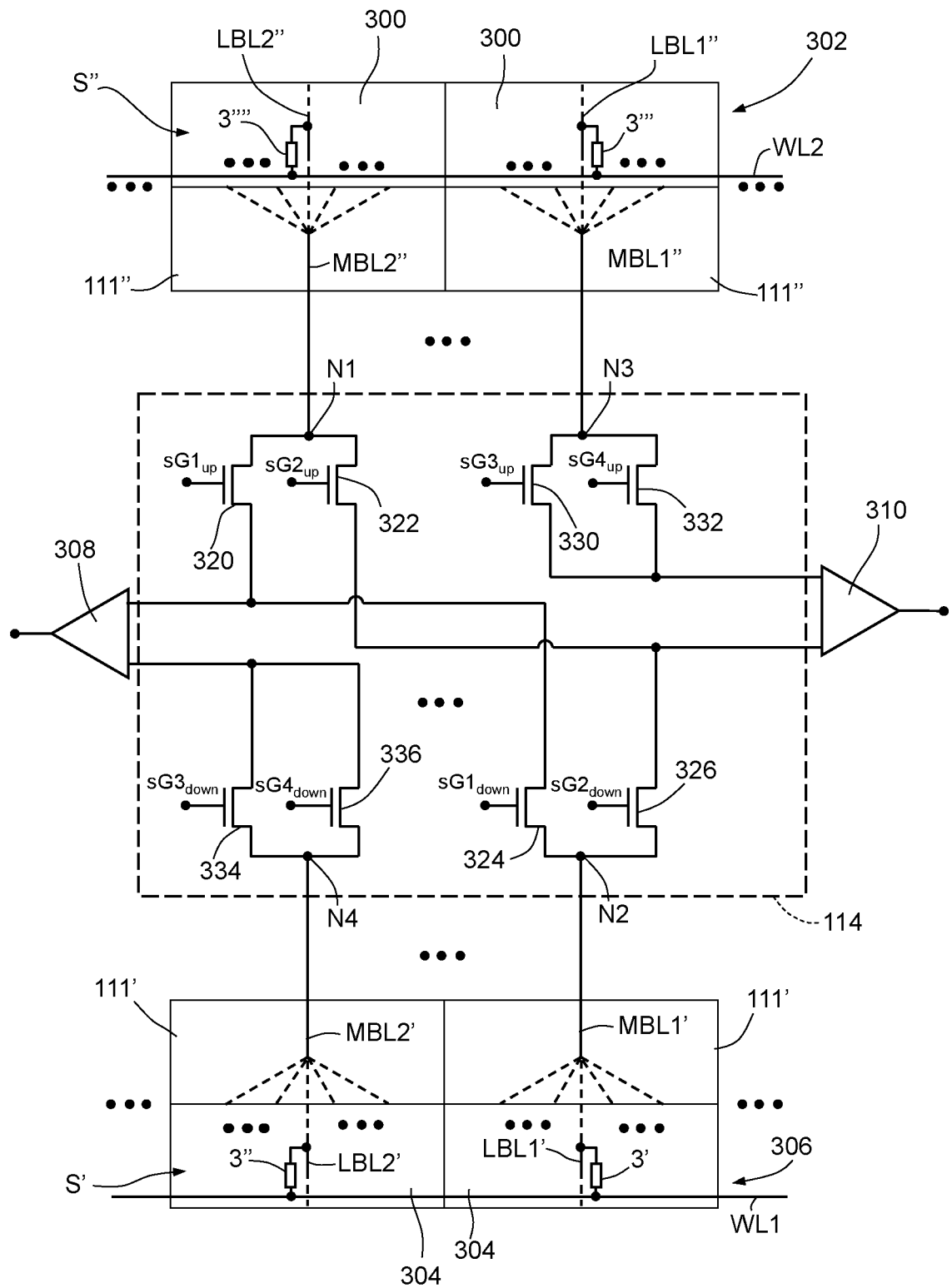
FIG. 6 shows a circuit diagram of a portion of a memory device.

As illustrated in FIG. 6, the PCM device 100 includes a switching circuit 114. In particular, represented in FIG. 6 is just one portion of the switching circuit 114, and in particular the portion coupled to the first, second, third, and fourth main bit lines MBL1', MBL2', MBL1", and MBL2"; as described hereinafter, the aforementioned signals $sG1_{up}$-$sG4_{up}$ and $sG1_{down}$-$sG4_{down}$ are sent to the aforesaid portion. Albeit not shown, the switching circuit 114 includes further portions, which are the same as the portion shown in FIG. 6 and are coupled to corresponding sets of four main bit lines. In use, each of these further portions of the switching circuit 114 receives the same signals $sG1_{up}$-$sG4_{up}$ and $sG1_{down}$-$SG4_{down}$.

FIG. 6 also shows a pair of sets of local bit lines 300 of the upper set of sectors (designated by 302), for example belonging to the second sector S", as well as a pair of sets of local bit lines 304 of the lower set of sectors (designated by 306), for example belonging to the first sector S' and symmetrical with respect to the aforementioned pair of sets of local bit lines 300. By way of example, the two sets of local bit lines 300 of the upper set of sectors 302 contain, respectively, the third and fourth local bit lines LBL1", LBL2". Further, the two sets of local bit lines 304 of the lower set of sectors 306 contain, respectively, the first and second local bit lines LBL1', LBL2'.

Further visible in FIG. 6 are two portions of the first first-level decoder circuit, which are designated by 111' and are each coupled to a corresponding set of the aforementioned two sets of local bit lines 304 of the lower set of sectors 306 so as to control coupling of the local bit lines with the first and second main bit lines MBL1', MBL2', respectively, as a function of the signals $YO<1:K>_{down}$. Further visible in FIG. 6 are two portions of the second first-level decoder circuit, which are designated by 111" and are each coupled to a corresponding set of the aforementioned two sets of local bit lines 300 of the upper set of sectors 302 so as to control coupling of the local bit lines with the third and fourth main bit lines MBL1", MBL2", respectively, as a function of the signals $YO<1:K>_{up}$.

In detail, the switching circuit 114 is coupled to a first sense amplifier 308 and a second sense amplifier 310. In addition, the switching circuit 114 includes a first upper transistor 320 and a second upper transistor 322, for example of an N type, and a first lower transistor 324 and a second lower transistor 326, for example of an N type. The switching circuit 114 further includes a first additional upper transistor 330 and a second additional upper transistor 332, for example of an N type, and a first additional lower transistor 334 and a second additional lower transistor 336, for example of an N type.

In detail, first conduction terminals of the first and second upper transistors 320, 322 are connected together so as to form a node N1. First conduction terminals of the first and second lower transistors 324, 326 are connected together so as to form a node N2. First conduction terminals of the first and second additional upper transistors 330, 332 are connected together so as to form a node N3. First conduction terminals of the first and second additional lower transistors 334, 336 are connected together so as to form a node N4.

The second conduction terminal of the first upper transistor 320 and the second conduction terminal of the first lower transistor 324 are both connected to a first input terminal of the first sense amplifier 308. In addition, the second conduction terminal of the second upper transistor 322 and the second conduction terminal of the second lower transistor 326 are both connected to a first input terminal of the second sense amplifier 310.

The second conduction terminals of the first and second additional upper transistors 330, 332 are connected to a second input terminal of the second sense amplifier 310. The second conduction terminals of the first and second additional lower transistors 334, 336 are connected to a second input terminal of the first sense amplifier 308.

The gate terminals of the first and second upper transistors 320, 322 and of the first and second additional upper transistors 330, 332 receive, respectively, the signals $sG1_{up}$, $sG2_{up}$, $sG3_{up}$, $sG4_{up}$; the gate terminals of the first and second lower transistors 324, 326 and of the first and second additional lower transistors 334, 336 receive, respectively, signals $sG1_{down}$, $sG2_{down}$, $sG3_{down}$, $SG4_{down}$.

As mentioned previously, the control logic 102 may operate in a first mode, in which a first type of differential reading of the memory array is carried out. In particular, in this first operating mode, the following features may be observed.

Signals $sWL_{down}$ and the signals $sWL_{up}$ select (and thus, bias) the first and second word lines WL1, WL2, respectively.

The signals YO<1:K>$_{down}$ are such as to select the first and second local bit lines LBL1', LBL2', which are thus connected, respectively, to the first and second main bit lines MBL1', MBL2'.

The signals YO<1:K>$_{up}$ are such as to select the third and fourth local bit lines LBL1", LBL2", which are thus connected, respectively, to the third and fourth main bit lines MBL1", MBL2".

Figure 7:
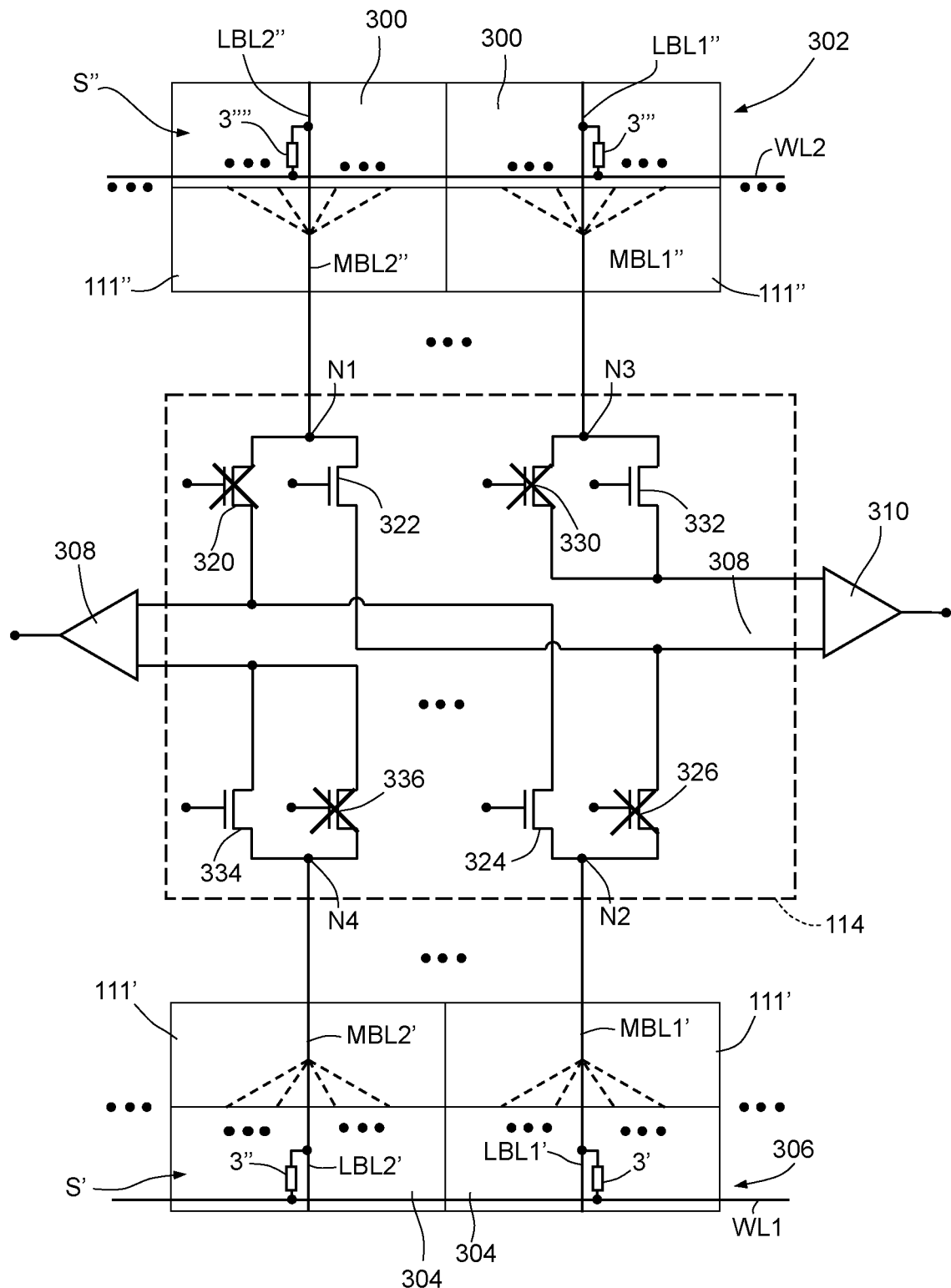
FIGS. 7-10 show the circuit diagram of FIG. 5 in different operating conditions.

As illustrated in FIG. 7, the signals sG1$_{up}$, sG2$_{up}$, sG3$_{up}$, sG4$_{up}$ are such that the first and second upper transistors 320, 322 are, respectively, off and on, while the first and second additional upper transistors 330, 332 are, respectively, off and on.

As shown once again in FIG. 7, the signals sG1$_{down}$, SG2$_{down}$, SG3$_{down}$, sG4$_{down}$ are such that the first and second lower transistors 324, 326 are, respectively, on and off, while the first and second additional lower transistors 334, 336 are, respectively, on and off.

In practice, in this first type of differential reading, the first and second local bit lines LBL1', LBL2' are, respectively, connected to the first and second input terminals of the first sense amplifier 308 through the first lower transistor 324 and the first additional lower transistor 334, respectively; the first sense amplifier 308 thus carries out differential reading of the first and second memory cells 3', 3". In addition, the third and fourth local bit lines LBL1", LBL2" are, respectively, connected to the second and first input terminals of the second sense amplifier 310 through the second additional upper transistor 332 and the second upper transistor 322, respectively; the second sense amplifier 310 thus carries out differential reading of the third and fourth memory cells 3''', 3''''. This differential reading occurs with substantially balanced loads, i.e., it envisages connection of the memory cells of each pair to a corresponding sense amplifier, by two paths, each formed by a respective local bit line and by a respective main bit line, these paths having, at least to a first approximation, the same length, and thus the same resistance, and the same parasitic capacitances.

The control logic 102 may also operate in a second mode, in which a second type of differential reading of the memory array is carried out. In particular, in this second operating mode, the following features may be observed.

The signals sWL$_{down}$ and the signals sWL$_{up}$ select the first and second word lines WL1, WL2, respectively.

The signals YO<1:K>$_{down}$ are such as to select the first and second local bit lines LBL1', LBL2', which are thus connected to the first and second main bit lines MBL1', MBL2', respectively.

The signals YO<1:K>$_{up}$ are such as to select the third and fourth local bit lines LBL1", LBL2", which are thus connected to the third and fourth main bit lines MBL1", MBL2", respectively.

Figure 8:
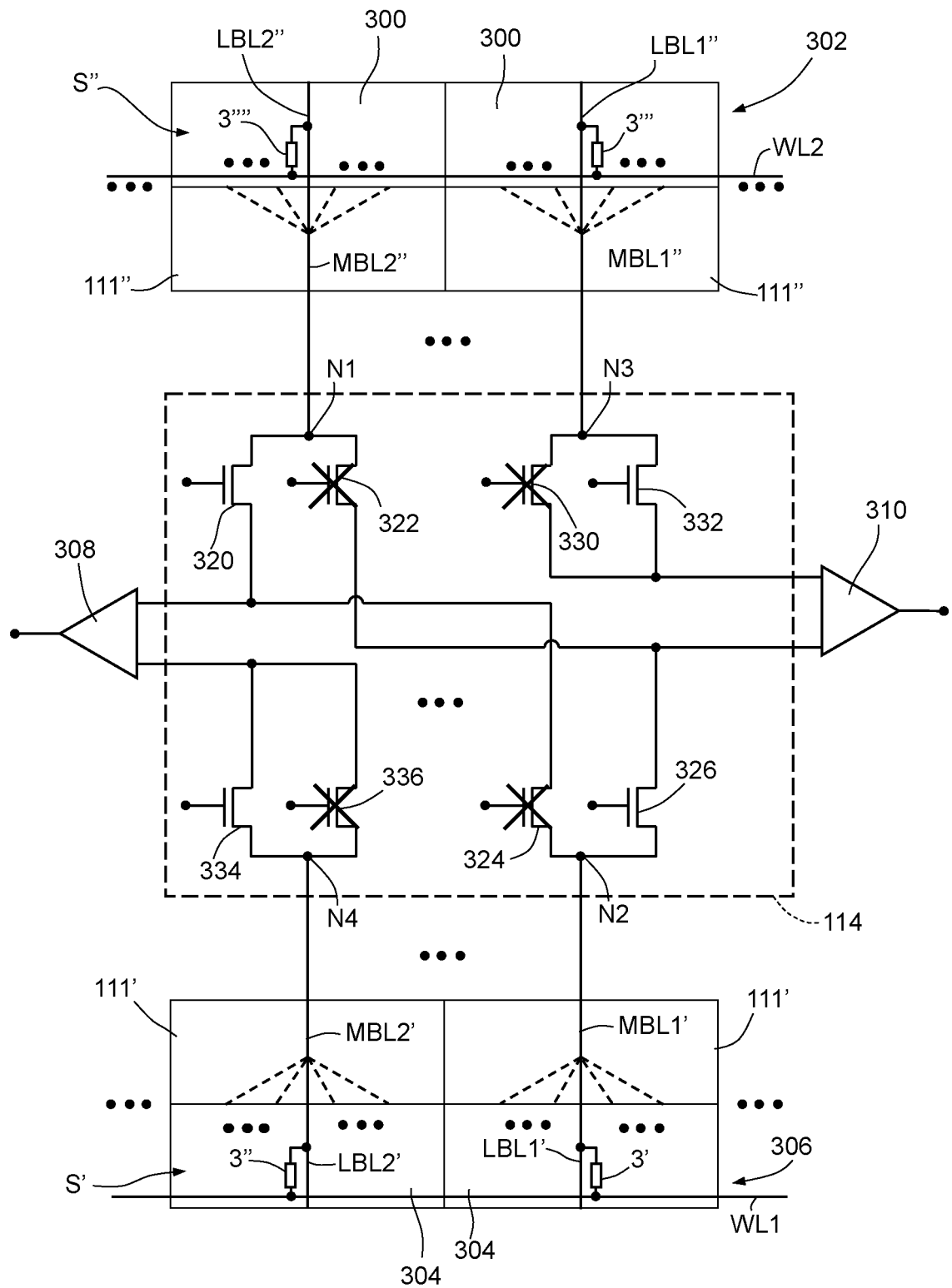

As illustrated in FIG. 8, the signals sG1$_{up}$, SG2$_{up}$, SG3$_{up}$, sG4$_{up}$ are such that the first and second upper transistors 320, 322 are, respectively, on and off, whereas the first and second additional upper transistors 330, 332 are, respectively, off and on.

As shown once again in FIG. 8, the signals sG1$_{down}$, sG2$_{down}$, sG3$_{down}$, sG4$_{down}$ are such that the first and second lower transistors 324, 326 are, respectively, off and on, whereas the first and second additional lower transistors 334, 336 are, respectively, on and off.

In practice, in this second type of differential reading, the first and second local bit lines LBL1', LBL2' are, respectively, connected to the first input terminal of the second sense amplifier 310 and to the second input terminal of the first sense amplifier 308 through the second lower transistor 326 and the first additional lower transistor 334, respectively. Furthermore, the third and fourth local bit lines LBL1", LBL2" are, respectively, connected to the second input terminal of the second sense amplifier 310 and to the first input terminal of the first sense amplifier 308 through the second additional upper transistor 332 and the first upper transistor 320, respectively.

Consequently, the first sense amplifier 308 carries out differential reading of the pair formed by the second and fourth memory cells 3", 3''''. Likewise, the second sense amplifier 310 carries out differential reading of the first and third memory cells 3', 3'''. Also the second type of differential reading thus occurs with substantially balanced loads since it has been assumed that symmetrical sectors are the same as one another.

The control logic 102 may also operate in a third mode, where a first type of single-ended reading of the memory array is carried out. In particular, in this third operating mode, the following features may be observed.

The signals sWL$_{down}$ select the first word line WL1, whereas the signals sWL$_{up}$ leave all the word lines of the upper set of sectors 302 deselected.

The signals YO<1:K>$_{down}$ are such as to select the first and second local bit lines LBL1', LBL2', which are thus connected to the first and second main bit lines MBL1', MBL2', respectively.

The signals YO<1:K>$_{up}$ are such as to select the first and second local bit lines LBL1", LBL2" of the second sector S", which are thus coupled, respectively, to the third main bit line MBL1" and to the fourth main bit line MBL2" so as to balance the capacitive loads on the sense amplifiers; however, since, as has been said previously, all the word lines of the upper set of sectors 302 are deselected, the third and fourth memory cells 3''', 3'''' are not involved in reading.

Figure 9:
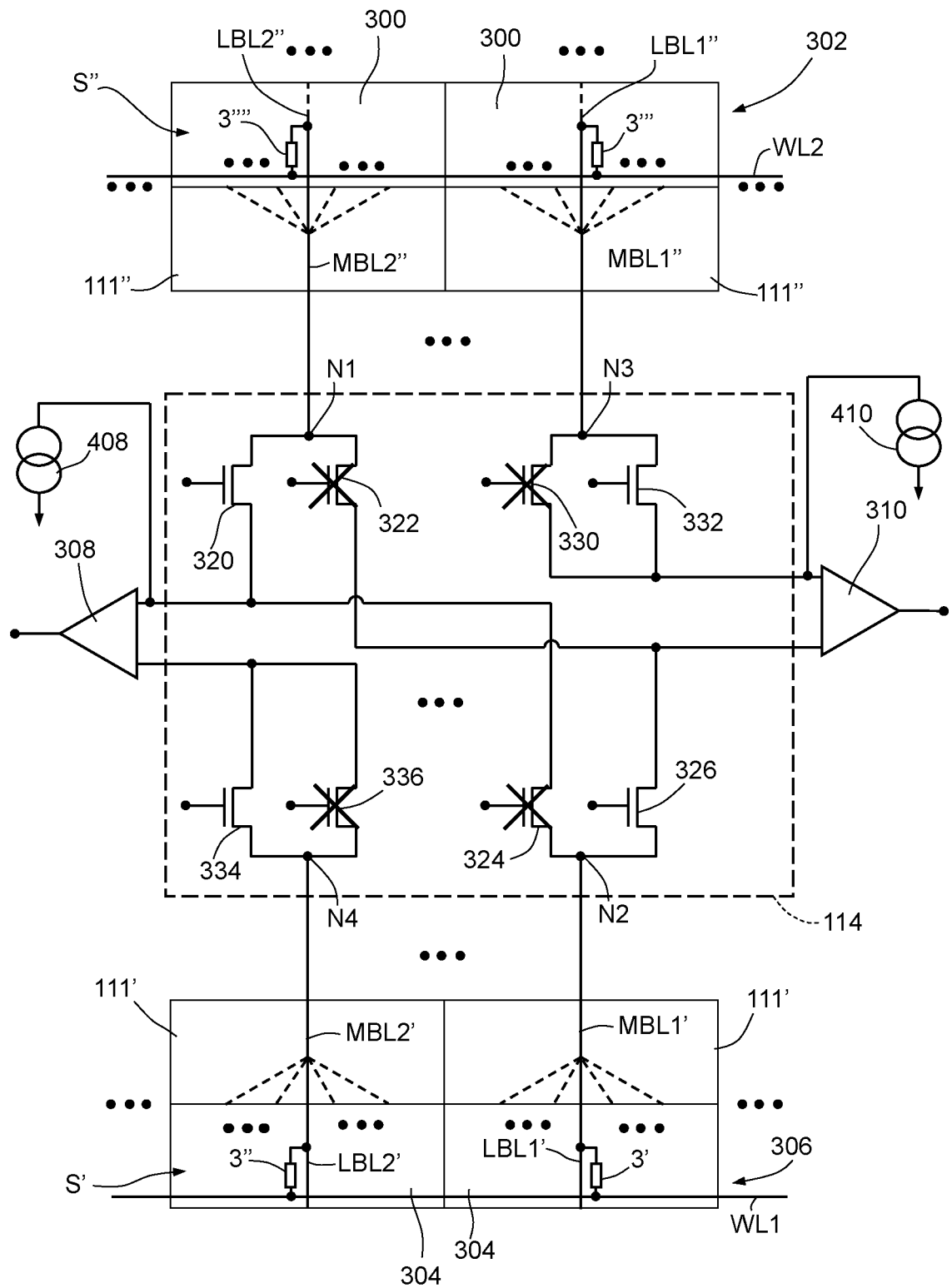

As illustrated in FIG. 9, the signals sG1$_{up}$, SG2$_{up}$, SG3$_{up}$, sG4$_{up}$ are such that the first and second upper transistors 320, 322 are, respectively, on and off, whereas the first and second additional upper transistors 330, 332 are, respectively, off and on.

As shown once again in FIG. 9, the signals sG1$_{down}$, SG2$_{down}$, SG3$_{down}$, sG4$_{down}$ are such that the first and second lower transistors 324, 326 are, respectively, off and on, whereas the first and second additional lower transistors 334, 336 are, respectively, on and off.

In addition, the first input terminal of the first sense amplifier 308 is connected (for example, by a corresponding switch, not shown, controlled by the control logic 102 with a purposely provided signal) to a first reference generator 408. The second input terminal of the second sense amplifier 310 is connected (for example, by a corresponding switch not shown, controlled by the control logic 102 with a purposely provided signal) to a second reference generator 410. The first and second reference generators 410 generate a same reference current.

In practice, the second local bit line LBL2' is connected, through the first additional lower transistor 334, to the second input terminal of the first sense amplifier 308, which thus carries out a comparison between the current flowing in the second memory cell 3" and the reference current, thus performing a single-ended reading of the second memory cell 3". The first local bit line LBL1' is connected, through the second lower transistor 326, to the first input terminal of the second sense amplifier 310, which thus carries out a comparison between the current flowing in the first memory cell 3' and the reference current, thus performing a single-ended reading of the first memory cell 3'.

Figure 10:
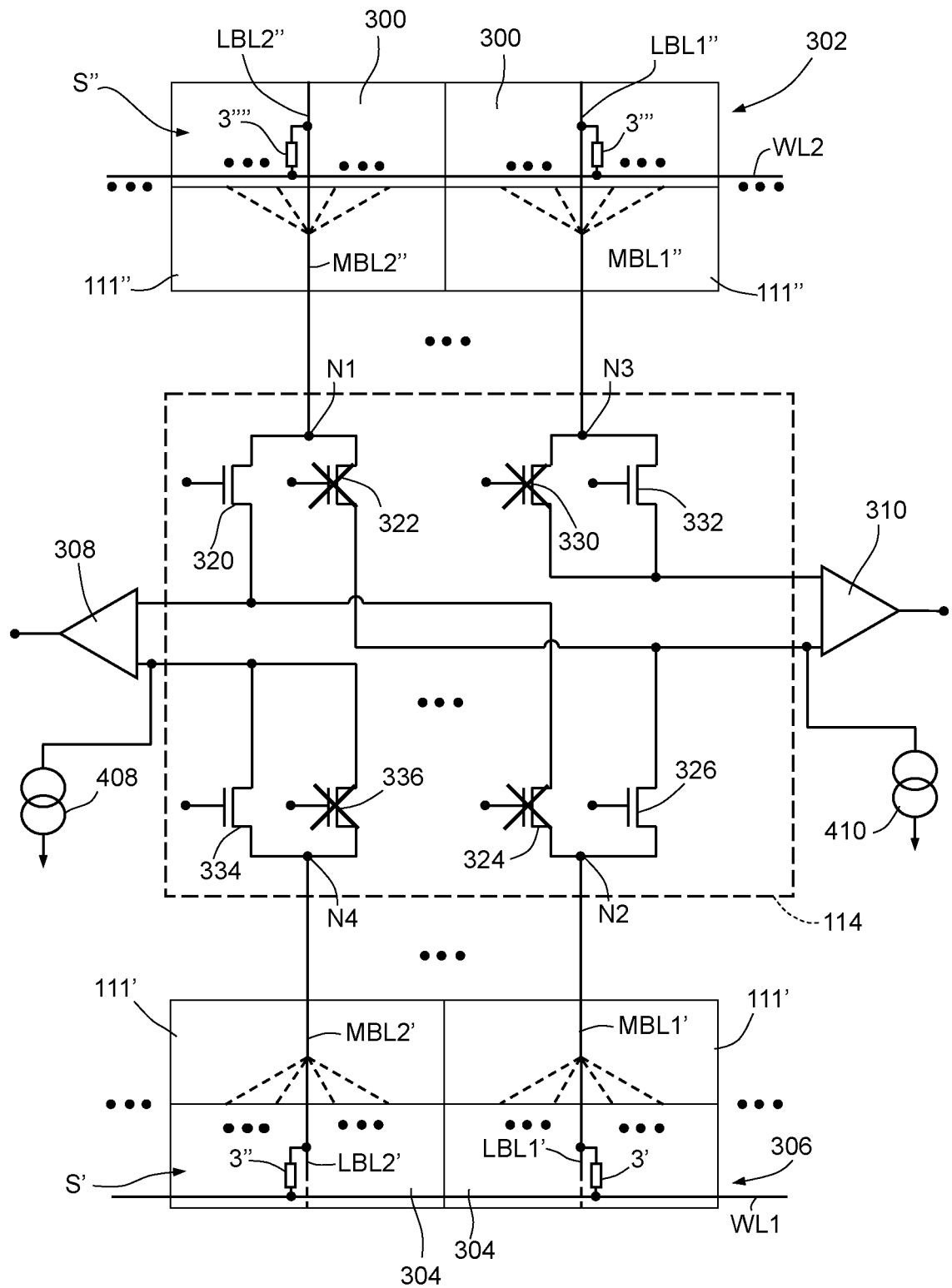

As illustrated in FIG. 10, the control logic 102 may also operate in a fourth mode, where a second type of single-ended reading of the memory array is carried out, where the third and fourth memory cells 3''', 3'''' are read in single-ended mode, via comparison with the reference current.

In this case, the first reference generator 408 is connected to the second input terminal of the first sense amplifier 308, while the second reference generator 410 is connected to the first input terminal of the second sense amplifier 310. In addition, the signals $sG1_{up}$, $SG2_{up}$, $sG3_{up}$, $sG4_{up}$, and the signals $sG1_{down}$, $sG2_{down}$, $sG3_{down}$, $sG4_{down}$ remain unvaried with respect to what has been described with reference to FIG. 9. Furthermore, the following may be observed.

The signals $sWL_{up}$ select the second word line WL2, whereas the signals $sWL_{down}$ leave all the word lines of the lower set of sectors 306 deselected.

The signals $YO<1:K>_{up}$ are such as to select the third and fourth local bit lines LBL1'', LBL2'', which are thus connected, respectively, to the third and fourth main bit lines MBL1'', MBL2''.

The signals $YO<1:K>_{down}$ are such as to select the first and second local bit lines LBL1', LBL2' of the first sector S', which are thus coupled, respectively, to the first and second main bit lines MBL1', MBL2' so as to balance the capacitive loads on the sense amplifiers.

The advantages of the solution discussed emerge clearly from the foregoing description.

In particular, the switching circuit 114 functions as routing circuit, which may be controlled by the control logic 102 and enables the latter to control the couplings between the sense amplifiers and the main bit lines.

In greater detail, the switching circuit 114 enables, if need be, switching between (i) two types of differential reading, which both take place with sense amplifiers that see on their own input terminals highly balanced capacitive loads, and (ii) a mode of single-ended reading of the memory array; also in the latter reading mode good balancing is obtained since also column decoding of the symmetrical sector is kept active with respect to the sector to which the cell that is to be read belongs. Balancing of the loads takes place both at the level of local bit lines and at the level of main bit lines.

The switching circuit 114 thus enables dynamic switching of the reading mode of the memory array 2, between (i) a differential reading mode, where a high capacity of retention of the data item is obtained, at the cost of a halving of the storage capacity, and (ii) a single-ended mode, where the storage capacity of the memory array 2 is doubled.

Figure 11:
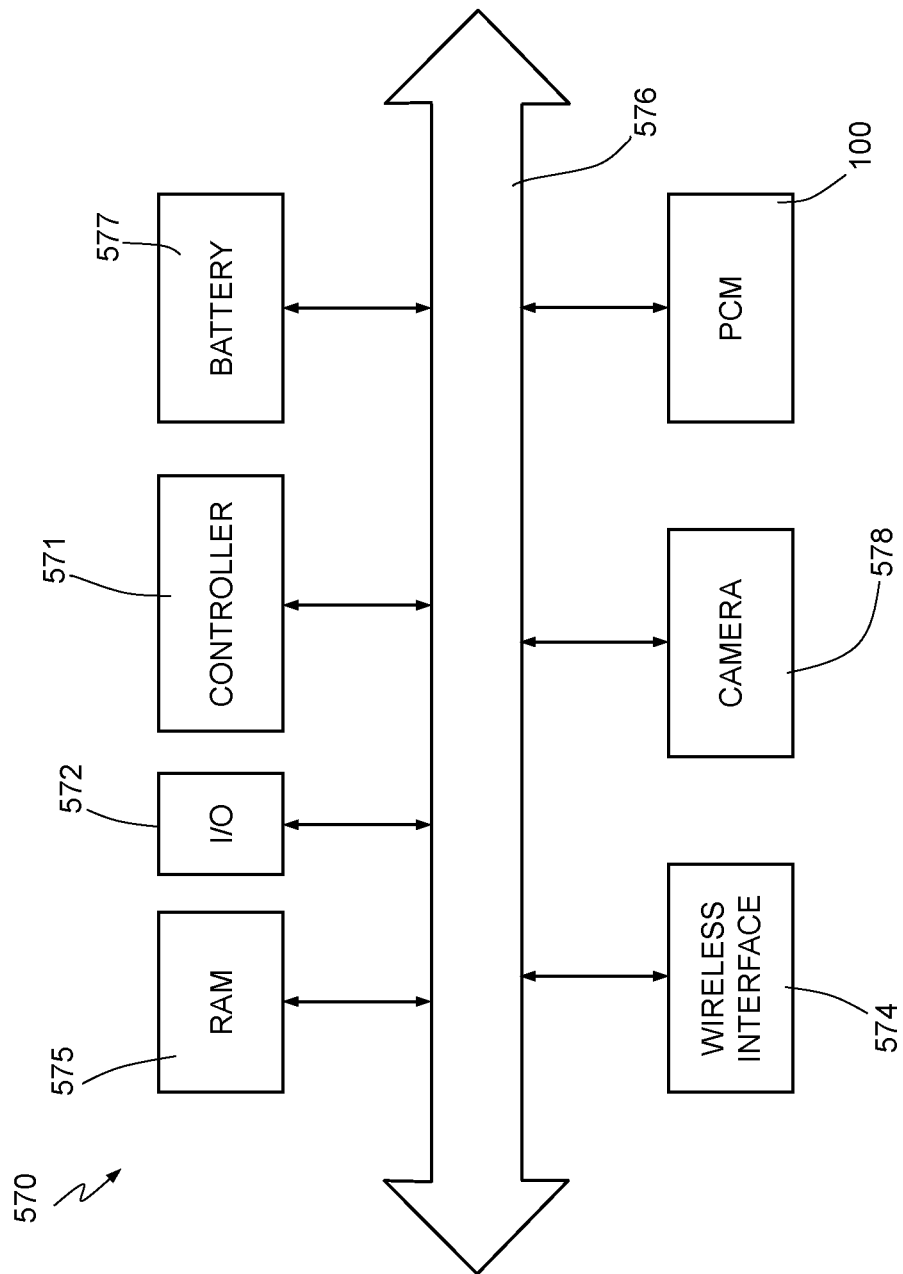
FIG. 11 shows a schematic block diagram of a possible electronic apparatus that incorporates a memory device.

The PCM device 100 may thus find use in numerous contexts. In this connection, FIG. 11 illustrates a portion of an electronic apparatus 570, which may for example be: a PDA (personal digital assistant); a portable or fixed computer, possibly with wireless data-transfer capacity; a mobile phone; a digital audio player; a photographic camera or a camcorder; or further devices that are able to process, store, transmit, and receive information.

In detail, the electronic apparatus 570 includes: a controller 571 (for example, provided with a microprocessor, a DSP, or a microcontroller); an input/output device 572 (for example, provided with a keypad and a display), for input and display of data; the PCM device 100; a wireless interface 574, for example an antenna, for transmitting and receiving data through a wireless radio-frequency communication network; and a RAM 575. All the components of the electronic apparatus 570 are coupled through a bus 576. It is possible to use a battery 577 as electrical supply source in the electronic apparatus 570, which may further be provided with a photographic camera, or video camera, or camcorder 578. Furthermore, the controller 571 may control the PCM device 100, for example co-operating with the control logic 102.

Finally, it is clear that modifications and variations may be made to the disclosure described and illustrated herein, without thereby departing from the scope of the present invention.

For instance, the present switching circuit 114 is independent of the characteristics of the memory cells, which may thus be different from memory cells of a PCM type, such as so-called cells of a Flash type. Likewise, the present switching circuit 114 is regardless of the details of implementation of the access elements of the memory cells, which may thus be formed, for example, by bipolar transistors, instead of by MOS transistors. In addition, all the transistors described, and in particular the transistors that form the switching circuit 114, may be replaced by different switching devices of a known type, provided that they are able to perform the corresponding functions of switches.

As mentioned above, what has been described previously with reference to reading of memory cells of the first sector S' and/or of the second sector S'' apply, with the due modifications, also to the case of reading, for example, of memory cells of the third and fourth sectors S''', S''''. For instance, in this case, the signals $sWL_{down}$ and the signals $sWL_{up}$ are supplied to the portions 5a of the row decoder 5 coupled, respectively, to the third and fourth sectors S''', S''''.

In general, the number of sectors may be different from what has been shown. In addition, with reference, for example, to the sector structure shown in FIG. 4A, it is possible for the third and fourth sectors S''', S'''' to have a number of rows different from the first and second sectors S', S'', remaining the same as one another and symmetrical with respect to one another.

Further possible are variants in which reading and programming do not envisage different main bit lines. Likewise, it is not necessary to double the column-decoding paths for the reading and programming operations; in other words, it is not necessary to provide both the reading decoder circuit 12 and the programming decoder circuit 13; rather, it is possible to resort to a single column-decoder circuit.

In addition, it is possible for the memory device in which the switching circuit 114 operates to implement additional hierarchical column-decoding levels as compared to what has been shown, in which case it is, for example, possible, in each lower set of sectors and each upper set of sectors, for the lines of the sets of local bit lines to be selectively coupled, as a function of the biasing signals, to corresponding intermediate bit lines, sets of intermediate bit lines being in turn associated to corresponding main lines, coupling between the main bit lines and the lines selected within the corresponding sets of intermediate bit lines being a function of further biasing signals.

It is further possible for the switching circuit 114 to carry out itself second-level decoding operations, in which case at least part of the signals $sG1_{up}$, $SG2_{up}$, $SG3_{up}$, $sG4_{up}$ and of the signals $sG1_{down}$, $sG2_{down}$, $sG3_{down}$, $SG4_{down}$ may be constituted by second-level biasing signals.

As regards, instead, the first and second additional upper transistors 330, 332 and the first and second additional lower transistors 334, 336, the following may be noted.

Each pair formed, respectively, by i) the first and second additional upper transistors 330, 332 and ii) the first and second additional lower transistors 334, 336 may be replaced by a corresponding single transistor (in the limit, even by an ohmic connection). In this connection, it may be noted in fact how, without any loss of generality, in the examples of operation described previously, the first additional upper transistor 330 and the second additional lower transistor 336 are always off, whereas the second additional upper transistor 332 and the first additional lower transistor 334 are always on. However, the adoption of the aforementioned pairs enables better balancing of the capacitive loads on the input terminals of the sense amplifiers; in general, a reduction of the balancing of the capacitive loads seen by the input terminals of the sense amplifiers entails a lengthening of the reading times. This having been said, in the presence of the aforementioned pairs, and considering one of them, it is possible for the additional transistor that is off to be different from the one described previously.

Finally, even though previously reference has been made to the case where, given the coupling described between the main bit lines and the sense amplifiers, selection of a local bit line also entails biasing of the bit line, variants are in any case possible in which the local bit lines may be selected and then be coupled to the main bit lines, without this automatically entailing biasing of the local bit lines.

What is claimed is:

1. A memory device comprising:
    a first sense amplifier;
    a second sense amplifier;
    a first lower switch arranged between a first lower main bit line and a first input of the first sense amplifier;
    a second lower switch arranged between the first lower main bit line and a first input of the second sense amplifier;
    a first upper switch arranged between a first upper main bit line and the first input of the first sense amplifier;
    a second upper switch arranged between the first upper main bit line and the first input of the second sense amplifier;
    a third lower switch arranged between a second lower main bit line and a second input of the first sense amplifier; and
    a third upper switch arranged between a second upper main bit line and a second input of the second sense amplifier.

2. The memory device according to claim 1, further comprising:
    a fourth lower switch arranged between the second lower main bit line to the second input of the first sense amplifier; and
    a fourth upper switch arranged between the second upper main bit line to the second input of the second sense amplifier.

3. The memory device according to claim 2, wherein the third lower switch is parallel to the fourth lower switch and the third upper switch is parallel to the fourth upper switch.

4. The memory device according to claim 1, further comprising a control logic circuit configured to control the first lower switch, the second lower switch, the first upper switch, and the second upper switch, and wherein the control logic circuit is configured to control coupling among the first sense amplifier, the second sense amplifier, the first lower main bit line, the second lower main bit lines, the first upper main bit line, and the second upper main bit line.

5. The memory device according to claim 4, wherein the control logic circuit is configured to operate in a first operating mode, wherein, in the first operating mode, the second lower switch and the first upper switch are open, and the first lower switch and the second upper switch are closed, wherein, in the first operating mode, the first lower main bit line and the first upper main bit line are coupled to the first input of the first sense amplifier and to the first input of the second sense amplifier, respectively.

6. The memory device according to claim 5, wherein the control logic circuit is configured to operate in a second operating mode, wherein, in the second operating mode, the first lower switch and the second upper switch are open and the second lower switch and the first upper switch are closed, wherein, in the second operating mode, the first lower main bit line and the first upper main bit line are coupled to the first input of the second sense amplifier and to the first input of the first sense amplifier, respectively.

7. The memory device according to claim 1, further comprising:
    a control logic circuit configured to control the first lower switch, the second lower switch, the first upper switch, and the second upper switch,
    wherein the control logic circuit is configured to control coupling among the first sense amplifier, the second sense amplifier, the first lower main bit line, the second lower main bit lines, the first upper main bit line, and the second upper main bit line,
    wherein the first lower main bit line is coupled to local bit lines of a first sector of a memory array comprising the first sector and a second sector, each of the first sector and the sector comprising a respective plurality of memory cells arranged in rows and columns, a respective plurality of word lines, and a respective plurality of local bit lines, and
    wherein the first upper main bit line is coupled to local bit lines of the second sector.

8. The memory device according to claim 7, further comprising:
    a first lower memory cell and a second lower memory cell respectively coupled to a first word line of the first sector and to a first local bit line and a second local bit line of the first sector;
    a first upper memory cell and a second upper memory cell respectively coupled to a second word line of the second sector and to a first local bit line and a second local bit line of the second sector;
    a row-decoder circuit controllable for selecting the word lines of the first sector and the second sector; and
    a column-decoder circuit controllable for selecting the local bit lines of the first sector and the second sector and for coupling the local bit lines selected to corresponding main bit lines.

9. The memory device according to claim 8, wherein the first lower memory cells and the second lower memory cells are arranged symmetrically with respect to the first upper memory cells and the second upper memory cells, respectively, and wherein the first sector and the second sector are identical.

10. The memory device according to claim 8, wherein, when the control logic circuit operates in a first operating mode, the control logic circuit is configured to control the column-decoder circuit to:
    couple the first local bit line and the second local bit line of the first sector to the first lower main bit line and the second lower main bit line, respectively; and
    couple the first local bit line and the second local bit line of the second sector to the second upper main bit line and the first upper main bit lines, respectively; and
    wherein, when the control logic circuit operates in the first operating mode, the control logic circuit is further configured to control the row-decoder circuit to:
        select the first word line and the second word line so that the first sense amplifier carries out differential reading of the first lower memory cell and the second lower memory cell, and so that the second sense amplifier carries out differential reading of the first upper memory cell and the second upper memory cell.

11. The memory device according to claim 8, wherein, when the control logic circuit operates in a second operating mode, the control logic circuit is configured to operate in a first configuration and a second configuration.

12. The memory device according to claim 11,
wherein, when the control logic circuit operates in the first configuration, the control logic circuit controls the column-decoder circuit to:
select the first word line, and
couple the first local bit line and the second local bit line of the first sector to the first lower main bit line and the second lower main bit line, respectively, so that the first lower memory cell and the second lower memory cell are coupled to the first input of the second sense amplifier and to the second input of the first sense amplifier, respectively; and
wherein, when the control logic circuit operates in the second configuration, the control logic circuit controls the column-decoder circuit to:
select the second word line, and
couple the first local bit line and the second local bit line of the second sector to the second upper main bit line and the first upper main bit lines, respectively, so that the first upper memory cell and the second upper memory cell are coupled to the second input of the second sense amplifier and to the first input of the first sense amplifier, respectively.

13. The memory device according to claim 12, further comprising:
a first reference circuit and a second reference circuit, which are configured to generate a reference electrical quantity controllable by the control logic circuit;
wherein, when the control logic circuit operates in the first configuration, the control logic circuit controls the column-decoder circuit to:
couple the first reference circuit and the second reference circuit to the first input of the first sense amplifier and to the second input of the second sense amplifier, respectively, so that the first sense amplifier and the second sense amplifier carry out readings of a single-ended type of the second lower memory cell and the first lower memory cell, respectively; and
wherein, when the control logic circuit operates in the second configuration, the control logic circuit controls the column-decoder circuit to:
couple the first reference circuit and the second reference circuit to the second input of the first sense amplifier and to the first input of the second sense amplifier, respectively, so that the first sense amplifier and the second sense amplifier carry out readings of a single-ended type of the second upper memory cell and the first upper memory cell, respectively.

14. The memory device according to claim 11, wherein, when the control logic circuit operates in the first configuration, the control logic circuit is further configured to control the row-decoder circuit so as to deselect the second word line; and wherein, when the control logic circuit operates in the second configuration, control the row-decoder circuit so as to deselect the first word line.

15. The memory device according to claim 8, wherein each of the first lower memory cell, the second lower memory cell, the first upper memory cell and the second upper memory cell comprise a respective storage element and a respective access element, which are electrically coupled, and wherein the storage element comprises a phase-change material, wherein the access element is formed by a MOSFET.

16. An electronic apparatus comprising:
a memory device comprising
a first sense amplifier;
a second sense amplifier;
a first lower switch arranged between a first lower main bit line and a first input of the first sense amplifier;
a second lower switch arranged between the first lower main bit line and a first input of the second sense amplifier;
a first upper switch arranged between a first upper main bit line and the first input of the first sense amplifier;
a second upper switch arranged between the first upper main bit line and the first input of the second sense amplifier;
a third lower switch arranged between a second lower main bit line and a second input of the first sense amplifier; and
a third upper switch arranged between a second upper main bit line and a second input of the second sense amplifier;
a controller; and
a bus configured to electrically couple the controller and the memory device.

17. A method for reading a memory of a memory device, the method comprising:
providing a first, a second, a third, and a fourth memory cell;
providing a first sense amplifier and a second sense amplifier;
providing a control logic and a switching circuit, the control logic configured to operate the switching circuit in four operating modes;
operating the switching circuit in a first operating mode to perform a differential reading of the first and second memory cells with the first sense amplifier and perform a differential reading of the third and fourth memory cells with the second sense amplifier;
operating the switching circuit in a second operating mode to perform a differential reading of the second and fourth memory cells with the first sense amplifier and perform a differential reading of the first and third memory cells with the second sense amplifier;
operating the switching circuit in a third operating mode to perform a single-ended reading of the first memory cell with first sense amplifier and perform a single-ended reading of the second memory cell with the second sense amplifier; and
operating the switching circuit in a fourth operating mode to perform a single-ended reading of the third memory cell with first sense amplifier and perform a single-ended reading of the fourth memory cell with the second sense amplifier.

18. The method of claim 17, providing the switching circuit comprises:
providing a first lower switch arranged between a first lower main bit line and a first input of the first sense amplifier;
providing a second lower switch arranged between the first lower main bit line and a first input of the second sense amplifier;

providing a first upper switch arranged between a first upper main bit line and the first input of the first sense amplifier;

providing a second upper switch arranged between the first upper main bit line and the first input of the second sense amplifier;

providing a third lower switch arranged between a second lower main bit line and a second input of the first sense amplifier; and providing a third upper switch arranged between a second upper main bit line and a second input of the second sense amplifier.

19. The method of claim 18, further comprising:

having the first memory cell coupled to a first local bit line and to a first word line of a first sector of a memory array comprising the first sector and a second sector;

having the second memory cell coupled to the first word line and a second local bit line of the first sector;

having the third memory cell coupled to a second word line of the second sector and to a third local bit line;

having the fourth memory cell coupled to the second word line and a fourth local bit line of the second sector;

wherein operating the switching circuit in the first operating mode comprises:

coupling the first and second local bit lines to the first and second inputs of the first sense amplifier through the first lower switch and the third lower switch, respectively; and coupling the third and fourth local bit lines to the first and second inputs of the second sense amplifier through the third upper switch and the second upper switch, respectively.

20. The method of claim 19, wherein operating the switching circuit in the second operating mode comprises:

coupling the first and second local bit lines to the first input of the second sense amplifier and to the second input of the first sense amplifier through the second lower switch and the third lower switch respectively; and coupling the third and fourth local bit lines to the second input of the second sense amplifier and to the first input of the first sense amplifier through the third upper switch and the first upper switch respectively.

* * * * *